United States Patent
Ishida et al.

(10) Patent No.: US 7,955,118 B2
(45) Date of Patent: Jun. 7, 2011

(54) TERMINAL PLATE CIRCUIT USING A PRESSING MEMBER

(75) Inventors: Jun Ishida, Osaka (JP); Kenji Hamano, Osaka (JP)

(73) Assignee: Onamba Co., Ltd. (JP)

( * ) Notice: Subject to any disclaimer, the term of this patent is extended or adjusted under 35 U.S.C. 154(b) by 0 days.

(21) Appl. No.: 12/664,140

(22) PCT Filed: Jun. 24, 2008

(86) PCT No.: PCT/JP2008/001630
§ 371 (c)(1),
(2), (4) Date: Dec. 11, 2009

(87) PCT Pub. No.: WO2009/081508
PCT Pub. Date: Jul. 2, 2009

(65) Prior Publication Data
US 2010/0170716 A1    Jul. 8, 2010

(30) Foreign Application Priority Data
Dec. 26, 2007   (JP) ................................. 2007-333449

(51) Int. Cl.
*H01R 4/48* (2006.01)
(52) U.S. Cl. ........................................ 439/441
(58) Field of Classification Search .......... 439/441, 439/435, 437, 786, 816
See application file for complete search history.

(56) References Cited

U.S. PATENT DOCUMENTS
7,794,268 B2 * 9/2010 Breen et al. ............... 439/441
7,896,686 B2 * 3/2011 Hoppe ...................... 439/441

FOREIGN PATENT DOCUMENTS
JP   08-273720    10/1996
JP   2004-063651   2/2004
JP   2004-311671  11/2004

OTHER PUBLICATIONS

WIPO (Japanese Patent Office), International Search Report for PCT/JP2008/001630 (4 pages).
WIPO (Japanese Patent Office), International Preliminary Report on Patentablity for PCT/JP2008/001630 (4 pages).

* cited by examiner

*Primary Examiner* — Khiem Nguyen
(74) *Attorney, Agent, or Firm* — Kolisch Hartwell, P.C.

(57) ABSTRACT

A terminal plate circuit including a terminal plate, a rectangular wire, and a pressing member, characterized in that a hole through which the rectangular wire penetrates is provided in the terminal plate; the rectangular wire is inserted into this hole so as to establish an electrical contact between the terminal plate and the rectangular wire; and the contact state is maintained by a pressing force of the pressing member to the part of the surface of the rectangular wire on the side opposite to the part of the surface of the rectangular wire that is in contact with the terminal plate, and that the pressing member has a sandwiching part that can sandwich the end of the terminal plate, and the pressing force of the pressing member to the rectangular wire is generated by sandwiching the end of the terminal plate with this sandwiching part.

3 Claims, 4 Drawing Sheets

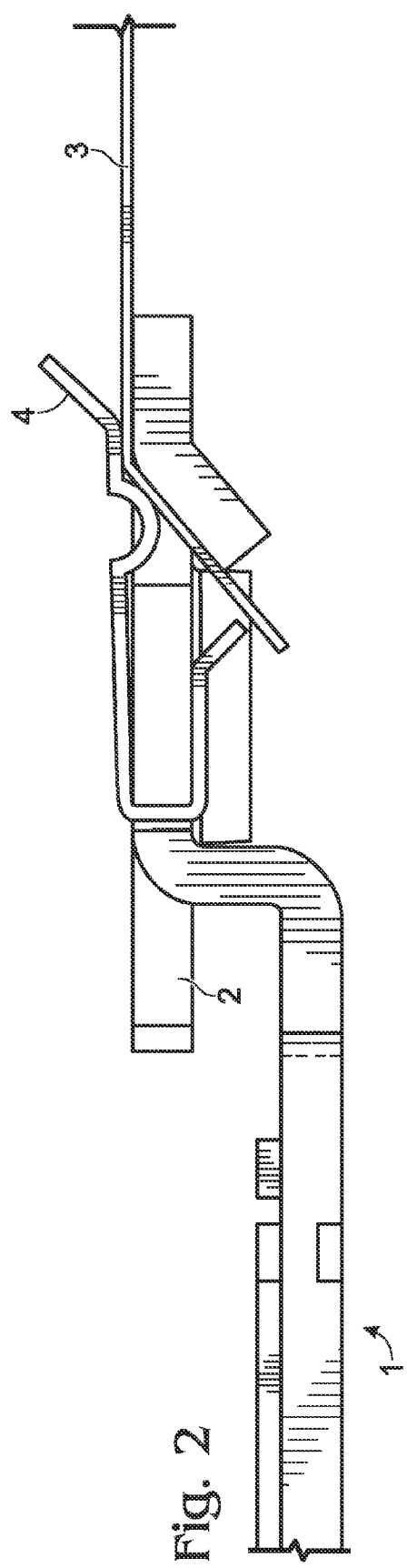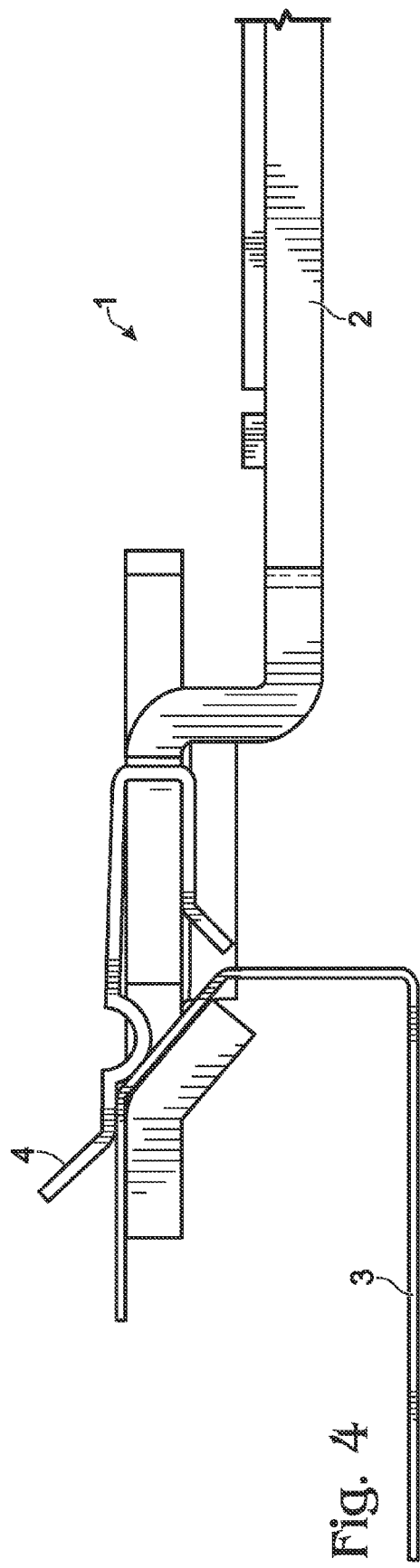

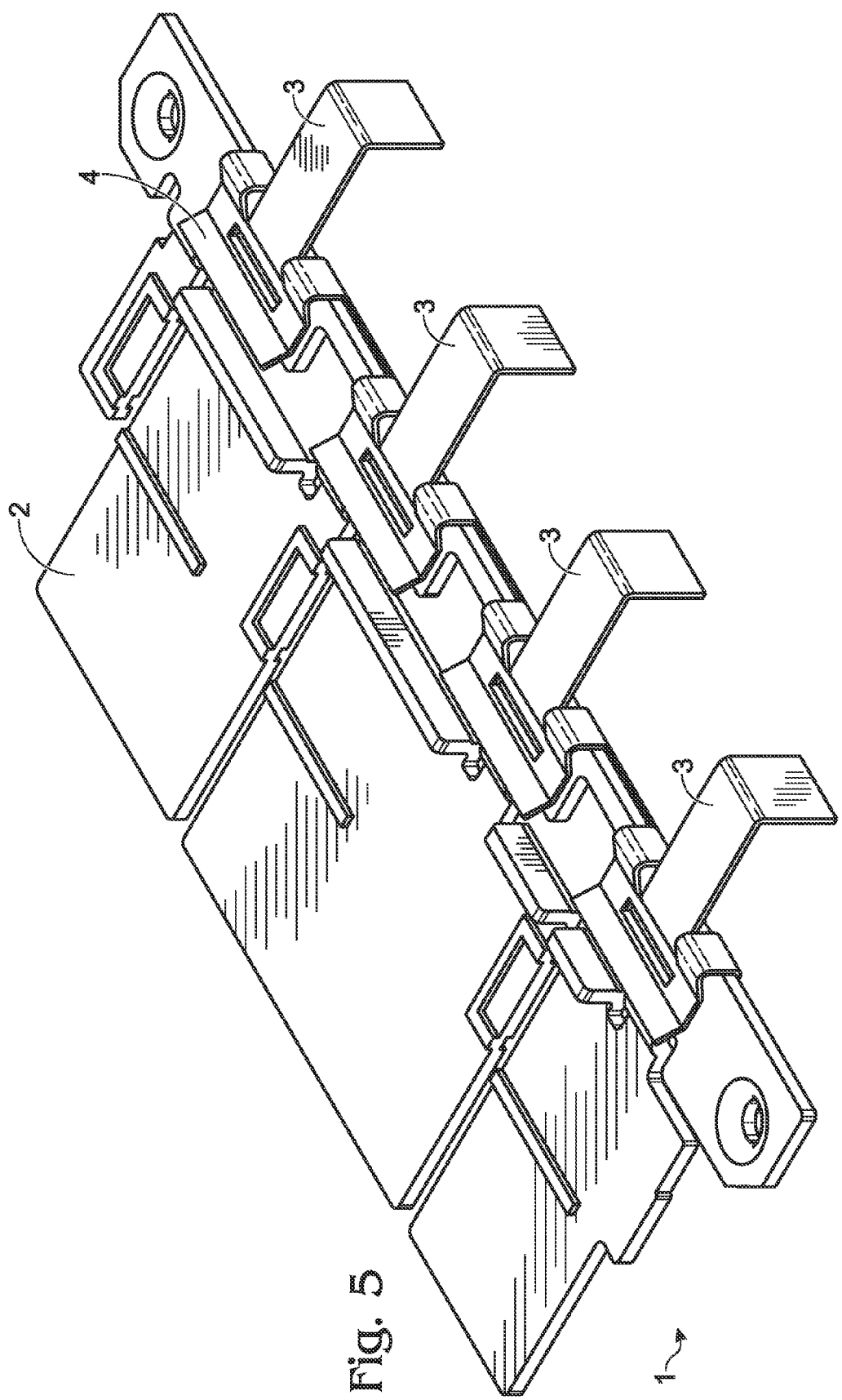

TERMINAL PLATE CIRCUIT USING A PRESSING MEMBER

TECHNICAL FIELD OF THE INVENTION

The present invention relates to a terminal plate circuit using a pressing member for securely holding an electrical connection state between a terminal plate and a rectangular wire even in a severe environment such as within a terminal box for solar cell panel.

BACKGROUND ART

Conventionally, in order to connect a rectangular wire electrically to a terminal plate in a terminal plate circuit, it has been carried out by providing a hole, through which the rectangular wire penetrates, in the terminal plate, inserting the rectangular wire through this hole from above or below, and soldering or welding a part at which the terminal plate and the rectangular wire are brought into electrical contact with each other.

However, in a case where the terminal plate circuit is used within a terminal box for solar cell panel, the electrical connection state between the terminal plate and the rectangular wire must be maintained for an extremely long period of time in the severe environment, so that the reliability has not been sufficient by a connection method implemented by only soldering or welding of the aforementioned background art.

On the other hand, as a method for enhancing the reliability of the electrical connection state between the terminal plate and the rectangular wire, it is possible to consider fixing the rectangular wire to the terminal plate with use of a screw and thereafter soldering or welding the fixed part; however, fixation with a screw involves placement of a screw hole and a work of mounting the screw, so that the step will be complex and hence is not desirable.

DISCLOSURE OF THE INVENTION

Problem that the Invention is to Solve

The present invention has been devised under such a circumstance of the background art, and an object thereof is to provide a terminal plate circuit in which the reliability of an electrical connection state between a terminal plate and a rectangular wire is enhanced by a simple method.

Means for Solving the Problem

As a result of eager studies in order to achieve the aforementioned object, the present inventors have found out that an electrical connection state having a high reliability can be maintained easily by using a pressing member that can sandwich the end of the terminal plate in a clip manner, sandwiching the end of the terminal plate with the pressing member, and allowing a part of the pressing member to press a contact part between the terminal plate and the rectangular wire by the sandwiching force of the pressing member, thereby completing the present invention.

Namely, the present invention is a terminal plate circuit including a terminal plate, a rectangular wire, and a pressing member, characterized in that a hole through which the rectangular wire penetrates is provided in the terminal plate; the rectangular wire is inserted into this hole so as to establish an electrical contact between the terminal plate and the rectangular wire; and the contact state is maintained by a pressing force of the pressing member to the part of the surface of the rectangular wire on the side opposite to the part of the surface of the rectangular wire that is in contact with the terminal plate, and that the pressing member has a sandwiching part that can sandwich the end of the terminal plate, and the pressing force of the pressing member to the rectangular wire is generated by sandwiching the end of the terminal plate with this sandwiching part.

In a preferable mode of the terminal plate circuit of the present invention, soldering or welding is carried out so as to cover a part at which the terminal plate and the rectangular wire are in electrical contact with each other, and the terminal plate circuit is used within a terminal box for solar cell panel.

ADVANTAGES OF THE INVENTION

The terminal plate circuit of the present invention can enhance the reliability of the electrical connection state between the terminal plate and the rectangular wire with a simple construction because the rectangular wire is pressed onto the terminal plate by a pressing force of the pressing member using the sandwiching force at the end of the terminal plate.

BRIEF DESCRIPTION OF DRAWINGS

FIG. 2 is a side view of the first embodiment of a terminal plate circuit of the present invention.

FIG. 4 is a side view of the second embodiment of a terminal plate circuit of the present invention.

FIG. 5 is a perspective view of the third embodiment of a terminal plate circuit of the present invention.

BEST MODE FOR CARRYING OUT THE INVENTION

The terminal plate circuit of the present invention will now be illustrated with reference to the drawings as follows, but the present invention is not limited thereto.

First Embodiment

Figure 1:
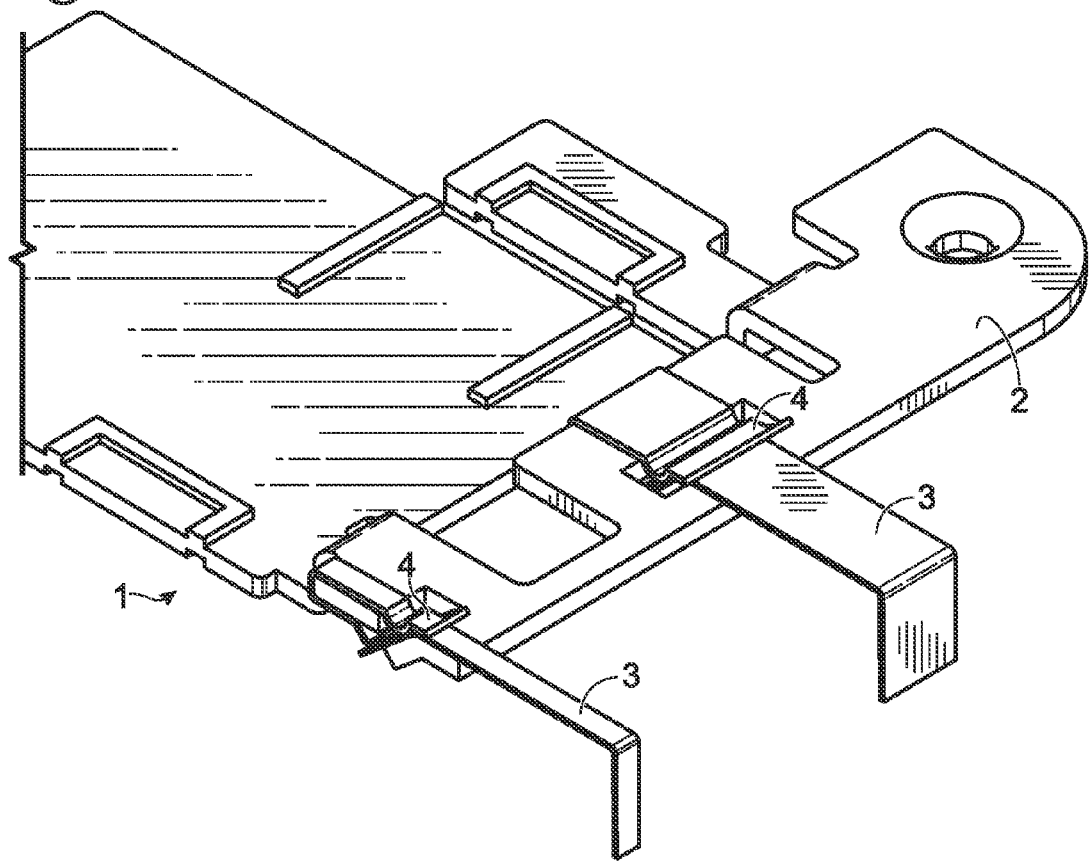
FIG. 1 is a perspective view of the first embodiment of a terminal plate circuit of the present invention.

FIG. 1 illustrates a perspective view of the first embodiment of a terminal plate circuit of the present invention, and FIG. 2 illustrates a side view thereof. As will be clear from FIG. 1, a terminal plate circuit 1 includes a terminal plate 2, a rectangular wire 3, and a pressing member 4. In the terminal plate 2, a hole is provided of a degree such that the rectangular wire 3 penetrates but cannot move largely in the lateral directions. The rectangular wire 3 is inserted into this hole of the terminal plate 2 so as to make a state of electrical connection to the terminal plate 2. In order to maintain this state securely, a part of the pressing member 4 presses onto the part of the surface of the rectangular wire 3 on the side opposite to the part of the surface of the rectangular wire 3 that is in contact with the terminal plate 2.

The pressing member 4 has a part that can sandwich the end of the terminal plate 2 in a clip manner. By a sandwiching force which is generated due to an action that a sandwiching pair of the sandwiching part tends to approach each other when sandwiching is made in this manner, a force that urges at least one of the sandwiching pair of the pressing member to press the rectangular wire 3 is generated. Specifically, the sandwiching pair of the sandwiching part are at a distance closer than the width of the end of the terminal plate or are in contact with each other when they do not sandwich the end of the terminal plate, and generate a restoring force of tending to come closer to each other to return to the original state when they sandwich the end of the terminal plate. With this configuration, at least one of the sandwiching pair will have a pressing force to the rectangular wire 3.

A part at which the pressing member 4 presses the rectangular wire 3 is not limited to a single part. As will be understood from FIG. 2, it is preferable that the pressing member 4 presses the rectangular wire 3 at plural sites such as a part at which the rectangular wire 3 is in contact with the terminal plate in the hole of the terminal plate 2 and a part at which the rectangular wire 3 is in contact with the terminal plate 2 in a plane part outside of the hole of the terminal plate 2.

For the terminal plate 2 and the rectangular wire 3 used in the terminal plate circuit 1 of the present invention, suitable selection may be made from among conventionally known ones. In the case of being used within a terminal box for solar cell panel, the terminal plate 2 is preferably enlarged as shown in FIG. 1 in order to enhance the cooling function thereof. Also, for the pressing member 4, any material (for example, metal or plastics) and shape can be adopted as long as it has a sandwiching part that can sandwich the end of the terminal plate 2 and generates a pressing force onto the rectangular wire 3 by sandwiching the end of the terminal plate 2 with this sandwiching part.

The terminal plate circuit of the present invention can make a further firm electrical connection state between the terminal plate 2 and the rectangular wire 3 by performing soldering or welding so as to cover the part at which the terminal plate 2 and the rectangular wire 3 are in electrical contact with each other, in addition to the pressing of the pressing member 4 onto the rectangular wire 3 such as described above.

Second Embodiment

Figure 3:
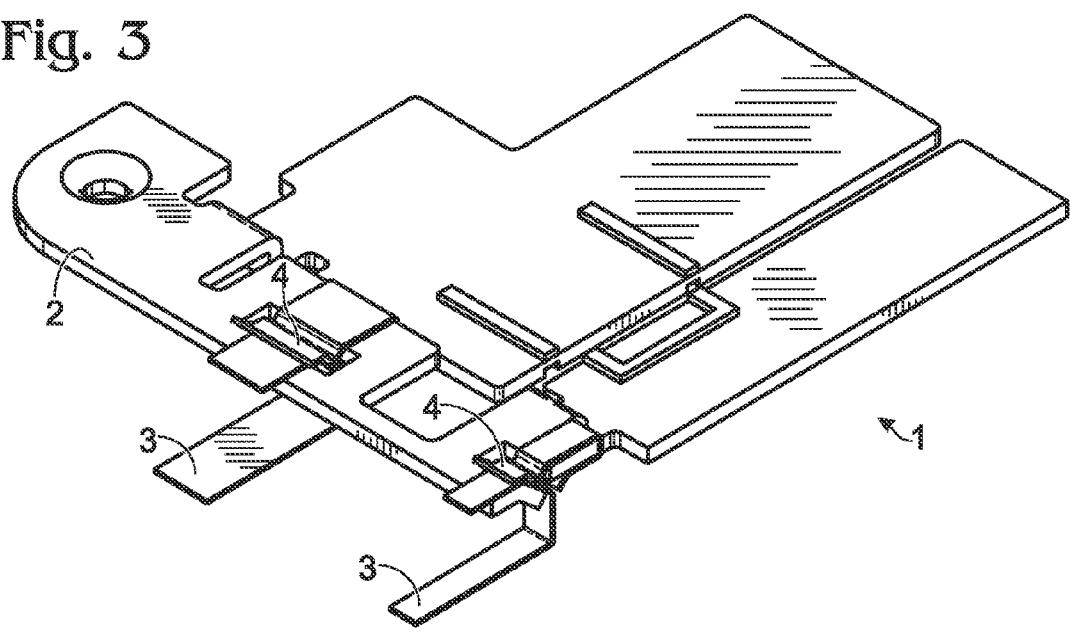
FIG. 3 is a perspective view of the second embodiment of a terminal plate circuit of the present invention.

FIG. 3 illustrates a perspective view of the second embodiment of a terminal plate circuit of the present invention, and FIG. 4 illustrates a side view thereof. In the above first embodiment, an example has been shown in which the rectangular wire 3 is inserted into the hole of the terminal plate 2 from above, and is pressed onto the rectangular wire 2 from above by the pressing member 4. In the second embodiment, an example will be shown in which the rectangular wire 3 is inserted into the hole of the terminal plate 2 from below, and the rectangular wire is pressed from above by the pressing member 4. The second embodiment is basically the same as the first embodiment except for the above-described feature.

Third Embodiment

FIG. 5 illustrates a perspective view of the third embodiment of a terminal plate circuit of the present invention. Also, FIG. 6 is a fractured perspective view illustrating a contact state of each constituent component of the third embodiment of the terminal plate circuit of the present invention, and FIG. 7 illustrates a side view thereof.

Figure 6:
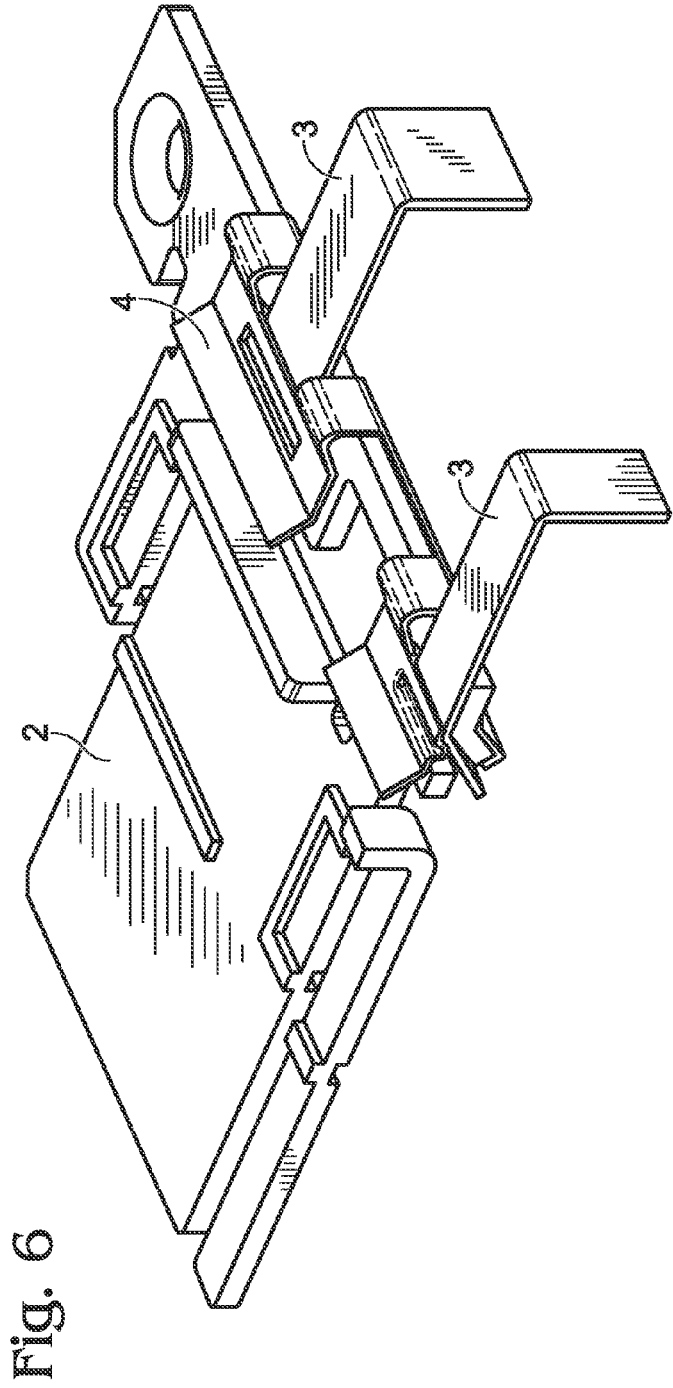
FIG. 6 is a fractured perspective view illustrating a contact state of each constituent component of the third embodiment of the terminal plate circuit of the present invention.
Figure 7:
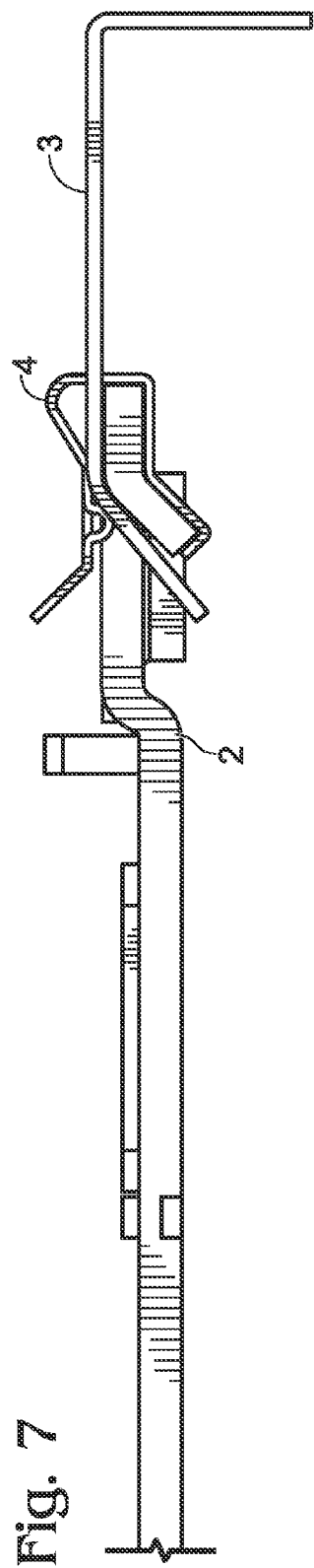
FIG. 7 is a fractured side view illustrating a contact state of each constituent component of the third embodiment of the terminal plate circuit of the present invention.

As will be understood from FIGS. 5 to 7, the terminal plate circuit 1 of this third embodiment is constructed in such a manner that a rectangular wire 3 is inserted from between the divided sandwiching parts of a pressing member 4, and penetrates through a hole of a terminal plate 2 so as to make an electrical connection state between the rectangular wire 3 and the terminal plate 2. Then, in order to maintain this electrical connection state securely, the pressing member 4 presses onto the part of the surface of the rectangular wire 3 on the side opposite to the part of the surface of the rectangular wire 3 that is in contact with the terminal plate 2 while sandwiching the end of the terminal plate with the sandwiching parts of the pressing member 4. The state of pressing of the rectangular wire 3 onto the terminal plate 2 by this pressing member 4 can be best understood from FIGS. 6 and 7, and is basically achieved by a principle similar to that of the first embodiment.

INDUSTRIAL APPLICABILITY

The terminal plate circuit of the present invention is suitable for the use in a severe environment such as within a terminal box for solar cell panel, because the reliability of an electrical connection state between a terminal plate and a rectangular wire is enhanced by a simple method.

What is claimed is:

1. A terminal plate circuit including a terminal plate, a rectangular wire, and a pressing member, characterized in that a hole through which the rectangular wire penetrates is provided in the terminal plate; the rectangular wire is inserted into this hole so as to establish an electrical contact between the terminal plate and the rectangular wire; and the contact state is maintained by a pressing force of the pressing member to the part of the surface of the rectangular wire on the side opposite to the part of the surface of the rectangular wire that is in contact with the terminal plate, and that the pressing member has a sandwiching part that can sandwich the end of the terminal plate, and the pressing force of the pressing member to the rectangular wire is generated by sandwiching the end of the terminal plate with this sandwiching part.

2. The terminal plate circuit according to claim 1 characterized in that soldering or welding is carried out so as to cover a part at which the terminal plate and the rectangular wire are in electrical contact with each other.

3. The terminal plate circuit according to claim 1 or 2 characterized in that the terminal plate circuit is used within a terminal box for solar cell panel.

* * * * *